United States Patent [19]

Takeuchi

[11] Patent Number: 4,804,845

[45] Date of Patent: Feb. 14, 1989

[54] LUMINESCENCE DETECTING DEVICES

[75] Inventor: Kenichi Takeuchi, Tokyo, Japan

[73] Assignee: Sony Corporation, Tokyo, Japan

[21] Appl. No.: 913,333

[22] Filed: Sep. 30, 1986

[30] Foreign Application Priority Data

Oct. 1, 1985 [JP] Japan .................. 60-218576

[51] Int. Cl.$^4$ ............................................. G01N 21/62
[52] U.S. Cl. .................................. 250/367; 250/484.1
[58] Field of Search .................. 250/367, 484.1, 483.1; 358/67, 69

[56] References Cited

U.S. PATENT DOCUMENTS

| | | | |
|---|---|---|---|
| 2,476,619 | 7/1949 | Nicoll | 250/486.1 |
| 2,553,182 | 5/1951 | Cage | 250/367 |
| 2,739,243 | 3/1956 | Sheldon | 250/367 |
| 3,125,681 | 3/1964 | Johnson | 250/367 |
| 3,426,212 | 2/1969 | Klaas | 250/486.1 |
| 3,484,606 | 12/1969 | Masi | 250/361 R |
| 4,088,508 | 5/1978 | Gravisse | 250/367 |
| 4,173,495 | 11/1979 | Rapp et al. | 250/483.1 |
| 4,306,248 | 12/1981 | Goodman | 358/67 |
| 4,437,007 | 3/1984 | Koslow et al. | 250/367 |
| 4,492,869 | 1/1985 | Suzuki et al. | 250/367 |
| 4,752,716 | 6/1988 | Takeuchi | 358/68 |

Primary Examiner—Janice A. Howell
Assistant Examiner—William F. Rauchholz
Attorney, Agent, or Firm—Hill, Van Santen, Steadman & Simpson

[57] ABSTRACT

A luminescence detecting device including a luminescence sensitive member made of a transparent resin or the like and containing at least two different kinds of organic phosphors dispersed therein. The first organic phosphor is operative to absorb fluorescence from incident radiation such as the index phosphor stripes from a reflex color cathode ray tube, and has a response spectrum which overlaps with the wavelength range of the incident fluorescence. The first phosphor is designed to emit fluorescence in a higher wavelength range upon excitation by the incident fluorescent radiation. The second phosphor is responsive to the fluorescence emitted by the first phosphor since the spectra of the two phosphors overlap. The second type of organic phosphor emits its own range of fluorescence in a particular wave band and can be detected by a luminescence sensing portion of the device to provide a signal which can be used to control the operation of the cathode ray tube.

3 Claims, 4 Drawing Sheets

LUMINESCENCE DETECTING DEVICES

BACKGROUND OF THE INVENTION

1. Field of the Invention

The present invention is in the field of luminescence detecting devices suitable for use in a color cathode ray tube of the beam-index type for detecting fluorescence from an index phosphor forming part of the phosphor screen of such devices.

2. Description of the Prior Art

A reflex color cathode ray tube arrangement of the beam-index type previously proposed may include a flat glass envelope which can be adapted generally to form color television receivers of relatively small size. The reflex color cathode ray tube of the beam-index type has a front panel portion which permits colored light to pass therethrough and a screen panel portion which faces the front panel portion and is provided on its inner surface with a phosphor screen including a plurality of color phosphor stripes of the three primary colors and a plurality of index phosphor stripes. Color images displayed on the phosphor screen are observed through the front panel portion and the fluorescence from each of the index phosphor stripes, i.e., the index fluorescence, is received by a photodetecting portion provided at the outside of the screen panel portion in relation to the phosphor screen.

Prior art structures of the type described are shown in FIGS. 1 to 4, inclusive. FIGS. 1 and 2 show an example of a reflex color cathode ray tube arrangement of the beam index type which is provided with a flat glass envelope 19 comprising a front panel portion 11, a screen panel portion 13 facing the front panel portion 11, and a neck portion 17 which is connected through a funnel portion 15 to both the front panel portion 11 and the screen panel portion 13. The front panel portion 11 is of rectangular shape and allows colored light to pass therethrough. The screen panel portion 13 is also of rectangular shape and is provided on its inner surface with a phosphor screen 21 extending in a rectangular pattern along the screen panel portion 13. The phosphor screen 21 includes a plurality of color stripes of the three primary colors and a plurality of index phosphor stripes. In the neck portion 17, an electron gun assembly 23 is located to produce an electron beam modulated in accordance with the color video signals supplied thereto. When the phosphor screen 21 is scanned by the electron beam from the electron gun assembly 23 on the side of the front panel portion 11, color images are displayed on the phosphor screen 21 and are observed through the front panel portion 11.

As shown in FIG. 3, the phosphor screen 21 is formed with a plurality of index phosphor stripes 29 which are fixed on the inner surface of the screen panel portion 13 and extend parallel to one another at regularly spaced intervals. An inorganic layer 31 is fixed on the inner surface of the screen panel portion 13 and extends between each adjoining pair of the index phosphor stripes 29. A thin metallic layer 33 which covers the index phosphor stripes 29 and the inorganic layer 31, and a plurality of color phosphor stripes of the three primary colors containing green phosphor stripes 35G, red phosphor stripes 35R and blue phosphor stripes 35B are fixed on the thin metallic layer 33 in a predetermined arrangement. The green phosphor stripes 35G, red phosphor stripes 35R and blue phosphor stripes 35B extend parallel to each other adjacent each of the index phosphor stripes 29 at regularly spaced intervals, and each adjoining pair of the green phosphor stripes 35G, red phosphor stripes 35R and blue phosphor stripes 35B is located between adjoining two of the index phosphor stripes 29. Each of the index phosphor stripes 29 is made of a phosphor which emits fluorescence with a peak at the range of ultraviolet light in spectral characteristics and having a short persistence characteristic, such, for example, as $Y_2SiO_5:Ce$.

At the outside of the screen panel portion 13 there is a luminescence sensitive plate member 25 disposed to face and extend along the outer surface of the screen panel portion 13, and a fluorescence detector 27 containing a photosensitive device such as a photodiode is attached to one end of the luminescence receiving plate member 25. Fluroescence which is emitted by each of the index phosphor stripes 29, i.e., index fluorescence, passes through the screen panel portion 13 and is operative to produce a secondary index fluorescence which is suitable for detection by the photosensitive device contained in the fluorescence detector 27. The luminescence receiving plate member 25 is formed, for example, of an acrylic resin in which a specific phosphor designed to absorb the index fluorescence from the index phosphor stripes 29 and emit a secondary index fluorescence is dispersed.

As shown in FIG. 4, when index fluorescence Li from each of the index phosphor stripes 29 enters into the luminescence receiving plate member 25, the phosphor which is dispersed in the luminescence receiving plate member 25 is excited by the index fluorescence Li and emits fluorescence. Although a portion indicated at $l_1$ exits the luminescence receiving plate member 25 and another portion $l_2$ of the fluorescence obtained from the phosphor dispersed in the luminescence receiving plate member 25 proceeds in the luminescence receiving plate member 25 in the opposite direction to the fluorescence detector 27, the remainder, $l_3$, of the fluorescence obtained from the phosphor in the luminescence receiving plate member 25 proceeds directly or with total reflections at the opposite surfaces of the luminescence receiving plate member 25 toward the fluorescence detector 27 to be handled the same as a secondary index fluorescence.

The fluorescence detector 27 produces an output signal from the secondary index fluorescence appearing in the luminescence receiving plate member 25 and this output signal or a signal reformed on the basis of the detection output signal is used as an index signal for causing the electron beam emitted from the electron gun assembly 23 to be modulated with a color video signal supplied to the electron gun assembly 23 in response to the momentary scanning positions of the electron beam on the phosphor screen 21.

The conversion of the index fluorescence from each of the index phosphor stripes 21 into secondary index fluorescence produced in the luminescence receiving plate member 25 is required because the wavelength of the index fluorescence from each of the index phosphor stripes 29 themselves is not appropriate to match the wavelength sensitive characteristics of the photosensitive device contained in the fluorescence detector 27. For example, the index fluorescence emitted by each of the index phosphor stripes 29 when made of the posphor $Y_2SiO_5:Ce$ has a peak level at a specific wavelength of about 400 nm and extends broadly to wavelengths on both sides of the specific peak. Since the time period of the index fluorescence obtained successively from the index phosphor stripes 29 when the phosphor screen 21 is scanned by the electron beam from the electron gun assembly 23 is very short and therefore the frequency of the detection output signal obtained from the fluorescence detector can be as high as 5 MHz, the index fluorescence does not match the characteristics of a silicon PIN diode used as the photosensitive device since ordinarily the PIN diode has a wavelength-sensitive characteristic in which its peak occurs for light having a wavelength of about 900 nm. Accordingly, the luminescence receiving plate member 25 is operative to receive the index fluorescence from each of the index phosphor stripes 29 with a peak specific wavelength of about 400 nm and must produce a secondary index fluorescence having a peak with a specific wavelength close to about 900 nm.

In the previously proposed luminescence receiving plate member 25, only a portion of the band of the index fluorescence output from the index phosphor strips 29 was effective to produce the secondary index fluorescence, and therefore the efficiency of conversion of index fluorescence from the index phosphor stripes 29 into secondary index fluorescence was undesirably low. Further, it is difficult as a practical matter to convert the index fluorescence from the stripes 29 directly into a secondary index fluorescence which has a peak level close to 900 nm so the secondary index fluorescence is not sufficiently close to 900 nm. This results in a low conversion efficiency and a possibility that the detection output signal from the secondary index fluorescence is insufficient to properly actuate the fluorescence detector 27 and, as a result, the color images would not be displayed properly on the phosphor screen.

SUMMARY OF THE INVENTION

The present invention provides a luminescence detecting device which avoids the foregoing problems of the prior art and efficiently detects fluorescence from an index phosphor provided in a color cathode ray tube of the beam-index type.

The present invention provides a luminescence detecting device including a luminescence receiving member and a luminescence sensing portion wherein the luminescence receiving member converts luminescence received thereby into secondary luminescence adapted for detection by the luminescence sensing portion, all with improved conversion efficiency so that a substantial detection output signal of the received luminescence can be effectively obtained.

In the present invention there is provided a luminescence detecting device comprising a luminescence sensitive receiving member which is made of a transparent resin in which at least two kinds of organic phosphors are dispersed. The luminescence receiving member is formed in the shape of a plate containing at least two types of organic phosphors suitable for excitation by the luminescence of the index strips. The first type of organic phosphor is operative to absorb fluorescence in a first wavelength range which overlaps with at least a portion of the wavelength range of the incident luminescence striking the luminescence receiving member and thereby emit a first fluorescence in a second wavelength range which overlaps with the longer wavelength side of the wavelength range of the incident luminescence. The second type of organic phosphor is operative to absorb fluorescence in a third wavelength range which overlaps with at least a portion of the second wavelength range and emits secondary fluorescence in a fourth wavelength range which extends beyond the longer wavelength side of the third wavelength range. In this way, the characteristics of the two phosphors are arranged in tandem or in a cascading sequence to energize the luminescence sensing portion more efficiently.

In the luminescence detecting device of the present invention when the index fluorescence from the phosphor stripes enters into the luminescence receiving member, the first type of organic phosphor absorbs at least a part of the luminescence in the first wavelength range and emits a first fluorescence in the second wavelength range in response to the luminescence absorbed thereby. The second type of organic phosphor absorbs at least a portion of the first fluorescence emitted by the first type of organic phosphor in the third wavelength range and emits a second fluorescence in a fourth wavelength range in response to the fluorescence absorbed thereby. A portion of the first fluorescence which is not absorbed by the second type of organic phosphor and the second fluorescence are directed to the luminescence sensing portion to be detected as secondary luminescence which is suitable for detection by the luminescence sensing portion. An output signal is thus obtained from the luminescence sensing portion in response to the secondary luminescence detected thereby.

With a conversion of the luminescence entering into the luminescence receiving member into a second luminescence caused by the conversion of luminescence entering the luminescence receiving member into the first fluorescence produced by the first phosphor and the conversion of the first fluorescence into the second fluorescence by means of the second type of organic phosphor, partial components of the luminescence entering into the luminescence receiving member which exist in a relatively broad wavelength range are used for producing the secondary luminescence and therefore the luminescence entering into the luminescence receiving member is converted into the second luminescence which is suitable for detection by the luminescence sensing portion with improved conversion efficiency. Furthermore, the second fluorescence emitted by the second type of organic phosphor can be selected so as to have a peak level with a specific wavelength which is the most preferable for detection by the luminescence sensing portion. Consequently, the output signal from the luminescence sensing portion is obtained at a sufficiently high level.

In the case where the luminescence detecting device of the present invention is used in a color cathode ray tube of the beam-index type for detecting index fluorescence, such fluorescence is detected with a substantially high sensitivity by the luminescence sensing portion and a detection output signal of the index fluorescence is obtained at a relatively large level from the luminescence sensing portion which generates the index signal. This results in a control operation for causing the electron beam emitted from the electron gun and modulated by the signals obtained by the momentary scanning positions of the electron beam on the phosphor screen to be quite stable and therefore stabilized color images are displayed on the phosphor screen. In addition, the dark electron current in the color cathode ray tube is decreased to lower the black level of color images on the phosphor screen so that color purity and the contrast characteristic of the color images are improved.

BRIEF DESCRIPTION OF THE DRAWINGS

A further description of the present invention will be made in conjunction with the attached drawings in which.

DESCRIPTION OF THE PREFERRED EMBODIMENTS

Figure 5:
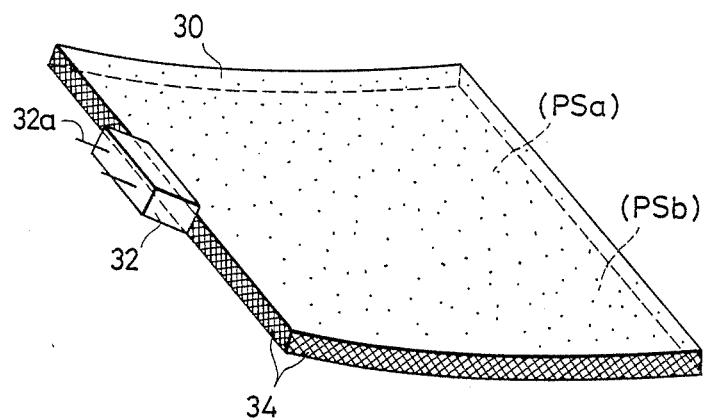
FIG. 5 is a schematic perspective view illustrating an embodiment of luminescence detecting device according to the present invention.

FIG. 5 illustrates an example of the luminescence detecting device according to the present invention. This form of the invention includes a luminescence receiving plate member 25 and the fluorescence detector 27 shown in FIGS. 1 and 2 used in a reflex color cathode ray tube arrangement as in FIGS. 1 and 2.

Figure 1:
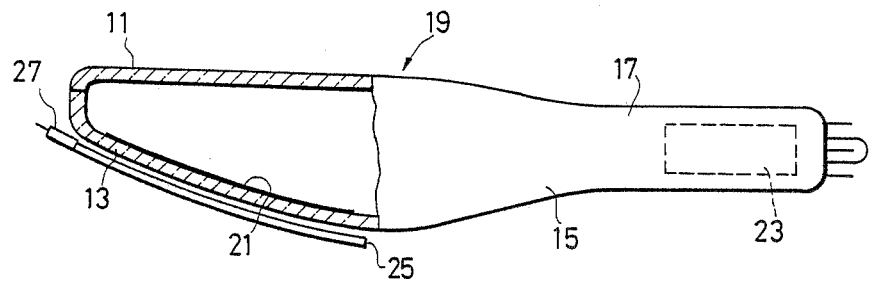
FIG. 1 is a somewhat schematic side elevational view, partly in cross section, illustrating a previously proposed reflex color cathode ray tube of the beam-index type.
Figure 2:
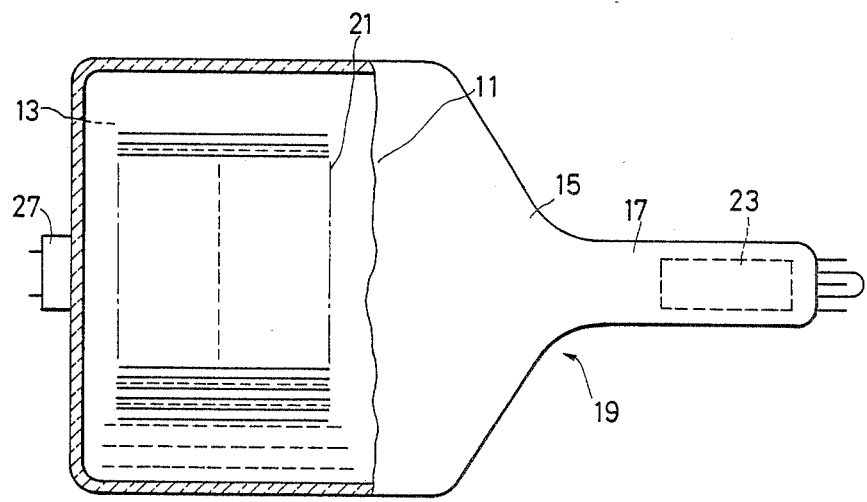
FIG. 2 is a schematic plan view including a partial sectional view of the reflex color cathode ray tube arrangement shown in FIG. 1.
Figure 3:
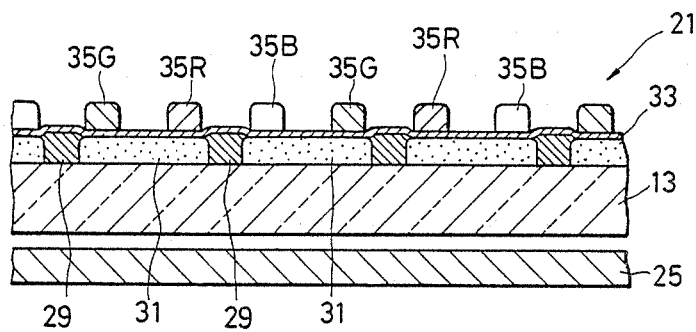
FIG. 3 is a cross-sectional view showing a portion of the reflex color cathode ray tube arrangement of FIGS. 1 and 2.
Figure 4:
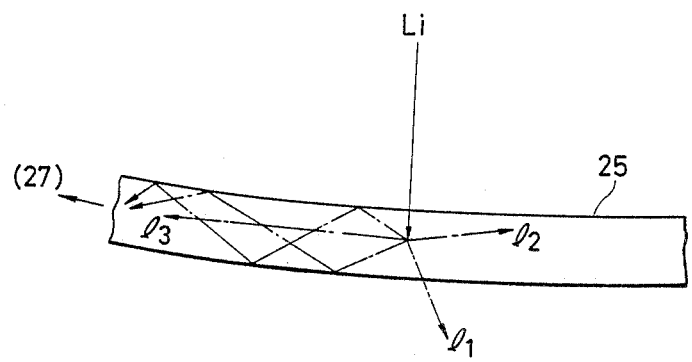
FIG. 4 is an illustration used for explaining the detection of index fluorescence in the reflex color cathode ray tube arrangement of the type shown in FIGS. 1 and 2.

The example of FIG. 5 comprises a luminescene receiving member 30 shaped into a curved rectangular plate with a fluorescence detector 32 attached to one side of the luminescence receiving member 30. The luminescence receiving member 30 is made, for example, by injection molding a transparent acrylic resin in which two types of organic phosphors, PSa and PSb are dispersed and the plate is shaped to have a pair of opposite surfaces each extending along the outer surfaces of a screen panel portion. The panel portion forms a part of a glass envelope of a beam-index type color cathode ray tube arrangement such as shown in FIGS. 1 and 2 and is provided with a phosphor screen on the inner surface thereof.

Figure 6:
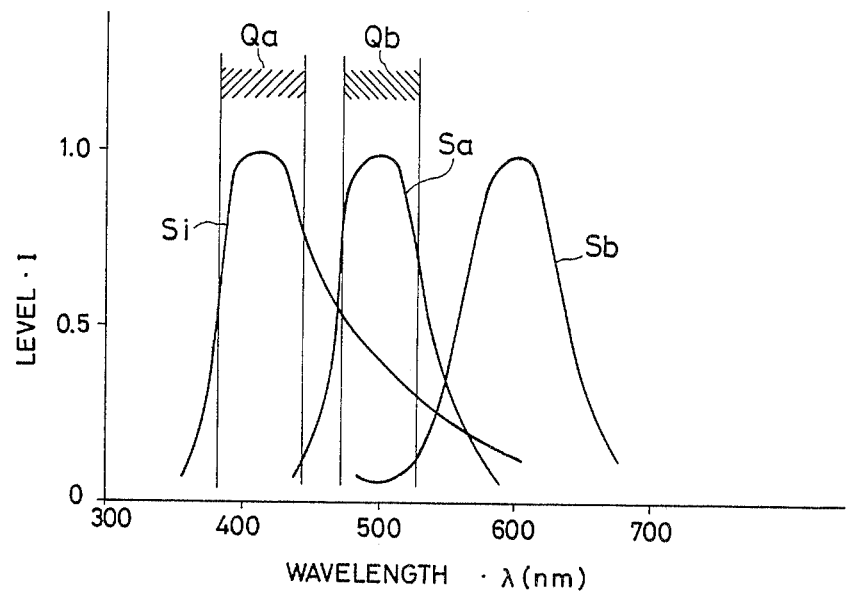
FIG. 6 is a graph for explaining the operation of the luminescence receiving member employed in the embodiment shown in FIG. 5.

The organic phosphors PSa and PSb have emission spectrum characteristics as indicated with the curves Sa and Sb, respectively, in FIG. 6. The vertical axis represents the normalized level (I) and the horizontal axis represents wavelength. In FIG. 6, the emission spectrum characteristic of the phosphor $Y_2SiO_5:Ce$ used for forming the index phosphor stripes of the type shown in FIGS. 1 and 2 is indicated by a curve Si.

As apparent from FIG. 6, the index phosphor PSi emits a fluorescence having a peak level at a specific wavelength of about 400 nm and extends broadly in a range of wavelengths exceeding the specific wavelength at which the peak level appears. The organic phosphor PSa emits fluorescence having a peak level at a specific wavelength of about 500 nm and overlaps the wavelength range emitted by the index phosphor PSi extending to the longer wavelength side. The organic phosphor PSb emits fluorescence at a peak level of about 600 nm and is excitable within a wavelength range existing on the longer wavelength side of the wavelength range of the fluorescence emitted by the organic phosphor PSa. The organic phosphor PSa absorbs fluorescence in a wavelength range Qa shown in FIG. 6 which overlaps with the wavelength range of the fluorescence emitted by the index phosphor PSi. The organic phosphor PSb absorbs fluorescence in a wavelength range Qb shown in FIG. 6 and overlaps with the wavelength range of the fluorescence emitted by the organic phosphor PSa.

These organic phosphors PSa and PSb are the same types of phosphors as used in light-collecting resins assuming a green color and a red color respectively, and are supplied under the trade name "LISA-Plastics" by the Bayer Company in West Germany.

On the sides of the luminescence receiving member 30 in which the organic phosphors PSa and PSb are dispersed, a thin metallic layer 34 is provided such, for example, as by the vacuum deposition of aluminum on the perimeter of the member except that portion to which the fluorescence detector 32 is attached. The fluorescence emitted in the luminescence receiving member 30 is directed toward the sides of the member 30 and is reflected at the thin metallic layer 34 toward the inside of the luminescence receiving member 30.

The fluorescence detector 32 contains, for example, a silicon PIN diode as a photosensitive element and receives the fluorescence emitted in the luminescence receiving member 30 and directed to the portion of the sides of the luminescence receiving member 30 on which the thin metallic layer 34 is not provided. Then, the fluorescence detector 32 produces an output signal in response to the fluorescence from the luminescence receiving member 30 at an output terminal 32a.

When the fluorescence detecting device thus constituted receives the index fluorescence emitted by the index phosphor stripes with the spectrum indirected at curve Si of FIG. 6, the organic phosphor PSa dispersed in the luminescence receiving member 30 absorbs a part of the index fluorescence in the wavelength range Qa shown in FIG. 6 and emits fluorescence in the wavelength range which extends to the longer wavelength side of the wavelength range of the index fluorescence in accordance with the emission spectrum characteristics identified at curve Sa in FIG. 6. Then, the organic phosphor PSb also dispersed in the luminescence receiving member 30 absorbs a part of the index fluorescence and a part of the fluorescence emitted by the organic phosphor PSa in the wavelength range Qb shown in FIG. 6 and is excited thereby. It emits fluorescence in the wavelength range which extends to the longer wavelength side of the wavelength range of the fluorescence emitted by the organic phosphor PSa, in accordance with the emission spectrum characteristics indicated by the curve Sb in FIG. 6.

In the luminescence receiving member 30, the index fluorescence from the index phosphor stripes is converted substantially into fluorescence emitted by the organic phosphor PSb which has a peak level at a specific wavelength close to 900 nm at which the silicon PIN diode has a peak in sensitivity. The fluorescence emitted by the organic phosphor PSb is the main component of the secondary index fluorescence. In the conversion of the index fluorescence into secondary index fluorescence by the liminescence receiving member 30, partial components of the index fluorescence extending in a relatively broad wavelength range and the fluorescence emitted by the organic phosphor PSa are utilized for the production of the secondary index fluorescence.

The secondary index fluorescence thus obtained in the luminescence receiving member 30 is directed to the fluorescence detector 32 to be detected by the silicon PIN diode contained in the detector 32 and an output signal is obtained in response to the secondary index fluorescence detected by the silicon PIN diode at the output terminal 32a of the fluorescence detector 32. The output signals serves as a detection output signal of the index fluorescence.

Figure 7:
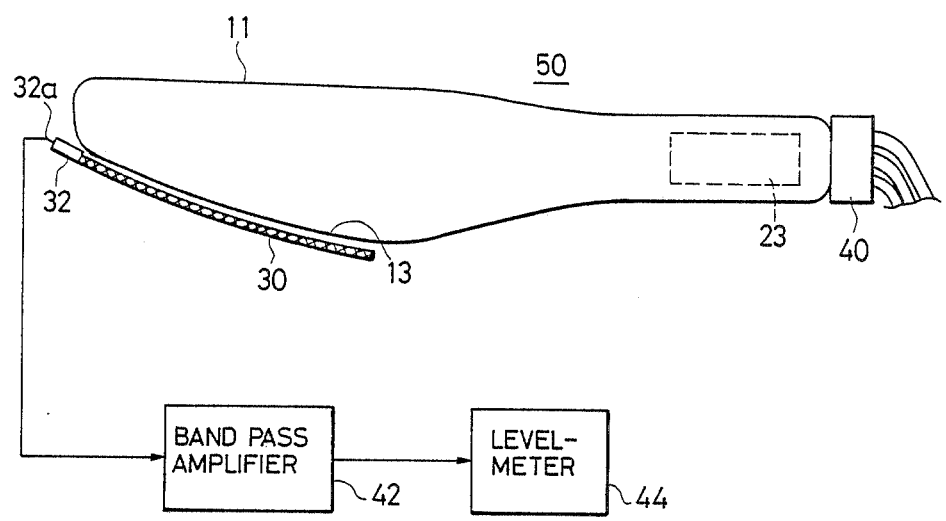
FIG. 7 is an illustration used for explaining measurements conducted in relation to the luminescence detecting operation of the embodiment shown in FIG. 5.

Experimental measurements of the detection output signal of the index fluorescence have been conducted with a measuring arrangement shown in FIG. 7. It utilized a color cathode ray tube 50 of the type shown in FIGS. 1 and 2. The luminescence receiving member 30 was disposed at the outside of the screen panel portion 13 of the beam-index color cathode ray tube 50 and an operational voltage source and signal supplier 40 was connected to the beam-index color cathode ray tube 50 as shown in FIG. 7. In this measuring arrangement, the beam-index color cathode ray tube 40 was four inches (10 cm) in size and the luminescence receiving member 30 was 100 mm in length, 100 mm in width, and 3 mm in thickness. The detection output signal obtained at the output terminal 32a of the fluorescence detector 32 was amplified by a band pass amplifier 42 and then measured by means of a levelmeter 44. The experimental measurements were done with several luminescence receiving members 30 which were different from each other in density of the organic phosphors PSa and PSb dispersed therein.

Comparative measurements of the detection output signal of the index fluorescence have also been conducted with several plates each made of a transparent acrylic resin in which only the organic phosphor PSa was dispersed with different densities and formed in the same size as the luminescence receiving member 30. Each sample was used instead of the luminescence receiving member 30 shown in the measuring arrangement of FIG. 7.

Figure 8:
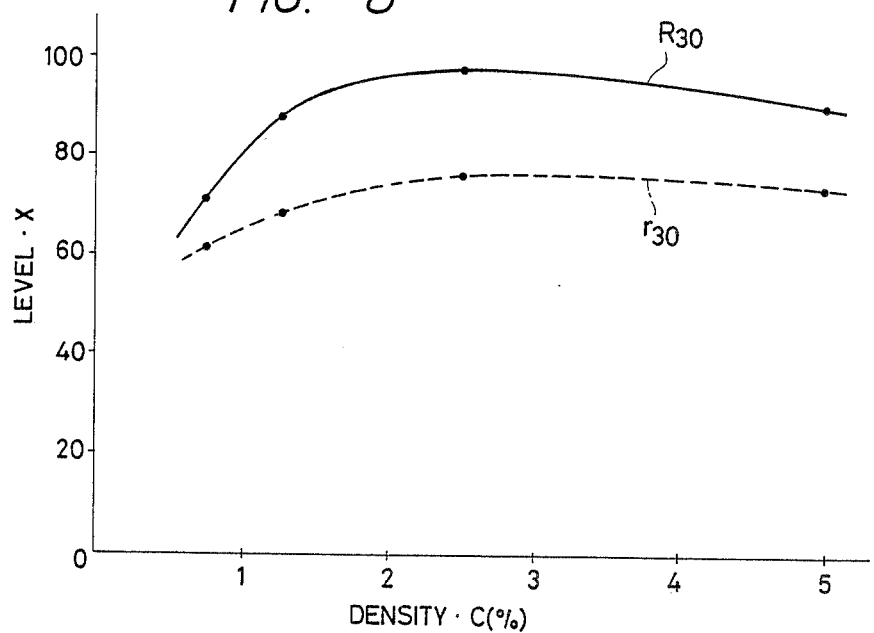
FIG. 8 is a graph for explaining the results of measurements conducted in relation to luminescence detecting operation of the embodiment shown in FIG. 5.

FIG. 8 shows the results of the measurements mentioned above in the form of a graph wherein the axis of the ordinates represents the normalized level (X) of the detection output signal and the axis of the abscissae represents density (C) of the organic phosphors in percent in the luminescence receiving member 30. In the graph of FIG. 8, the results of the experimental measurements conducted with the luminescence receiving members 30 differing from each other in density of the organic phosphors dispersed therein are indicated with a curve $R_{30}$ and the results of the comparative measurements conducted with plates of transparent acrylic resin differing from each other in density of the organic phosphor PSa dispersed therein are indicated with a curve $r_{30}$.

As apparent from the results shown in FIG. 8, when the luminescence receiving member 30 is used and the density of the organic phosphors PSa and PSb is equal to one or more percent, the detection output signal having a level of 1.2 to 1.4 times as much as that of the detection output signal obtained where only the organic phosphor PSa was dispersed is obtained. A detection output signal with a sufficient level could be obtained by using luminescence receiving members 30 in which the density of the organic phosphors PSa and PSb was from 1 to 5%. It will be thus understood that in the case where the index fluorescence from the index phosphor stripes in the beam-index type color cathode ray tube 50 is converted into secondary index fluorescence by the organic phosphors, the detection output signal of the index fluorescence is obtained at a level substantially higher than the signal obtained in the case where the index fluorescence is converted into secondary index fluorescence using only the organic phosphor PSa.

As described above, with the embodiment shown in FIG. 5, the detection output signal of the index fluorescence was obtained with a relatively large level from the fluorescence detector 32. Consequently, the control operation for modulating the signal supplied to the electron gun assembly 23 in response to the momentary scanning positions of the electron beam was carried out under stable conditions and stabilized color images were displayed on the phosphor screen. Since the electron beam for exciting each of the index phosphor stripes in the cathode ray tube 50 can be decreased in density, a dark electron current in the beam-index color type cathode ray tube was decreased to lower the black level of the color images on the phosphor screen, and color purity and contrast characteristics of the color images were improved.

As a result of the measurement of the contrast ratio of the color images on the phosphor screen conducted under the preferred condition set out above, a contrast ratio of more than 1.5 times that obtained with the use of the transparent acrylic resin containing only the organic phosphor PSa in a concentration of 5% has been obtained.

Although the above described embodiment involved a reflex cathode ray tube of the beam-index type such as shown in FIGS. 1 and 2, it is to be understood that the luminescence detecting device according to the present invention is not limited thereto and that it is possible to use the improvements of the present invention in a device used for detecting various other luminescences.

It should be evident that various modifications can be made to the embodiments shown without departing from the scope of the present invention.

I claim as my invention:

1. In a beam index cathode ray tube including a photosensitive element comprising a PIN diode which has a peak response at a relatively high wavelength relative to wavelengths of visible light, said photosensitive element further including a luminescence detecting device comprising:

a luminescence sensitive member composed of a transparent material containing at least two types of organic phosphors dispersed therein, the first type of organic phosphor being excitable by incident luminescence of a wavelength substantially lower than said relatively high wavelength entering therein and operative to absorb fluorescence in a first wavelength range which overlaps with the range of wavelengths in said incident luminescence and emit fluorescence in a second wavelength range overlapping with the longer wavelength portion of said incident luminescence, the second type of organic phosphor being excitable by flourescence in a third wavelength range overlapping with at least a part of said second wavelength range and emit fluorescence in a fourth wavelength range overlapping with the longer wavelength portion of said third wavelength range, and luminescence sensing means comprising said photosensitive element disposed in proximity to said luminescence sensitive member and capable of immediately detecting at least the flourescence in a fourth wavelength range emitted by said luminescence sensitive member to produce an output signal approximating said relatively high wavelength peak response of said photosenstivie element in response to the flourescence detected thereby.

2. A device according to claim 1 wherein said luminescence sensitive member is elongated and includes a thin metallic layer at the sides thereof and partially surrounding said member.

3. In a beam index type cathode ray tube, a luminescence sensitive member subject in use to impingement by incident flourescent radiation in a predetermined band of ultraviolet wavelengths comprising:

a plate composed of a transparent resin having dispersed therein at least two phosphors, the first of said phosphors being excitable over a range of wavelengths which overlaps said predetermined band of wavelengths at the higher end thereof, and the second of said phosphors being excitable over a range of wavelengths which overlaps the range of wavelengths emitted by excitation of said first phosphor at the higher end thereof such that excitation of said plate causes emission of flourescence from said first phosphor and excitation of said second phosphor by flourescence emitted by said first phosphor, such that the plate emits secondary flourescence at a higher wavelength band than in said predetermined band of incident radiation, and a photosensitive element comprising a PIN diode receiving said secondary flourescence and having a peak response at an infrared wavelength in said higher wavelength band, for immediately generating an output signal.

* * * * *